US012265123B1

United States Patent
Cai et al.

(10) Patent No.: US 12,265,123 B1
(45) Date of Patent: Apr. 1, 2025

(54) UNIVERSAL TEST CHIPLET

(71) Applicants: NANJING UNIVERSITY OF POSTS AND TELECOMMUNICATIONS, Jiangsu (CN); NANTONG INSTITUTE OF NANJING UNIVERSITY OF POSTS AND TELECOMMUNICATIONS CO., LTD, Jiangsu (CN)

(72) Inventors: Zhikuang Cai, Jiangsu (CN); Xiaoting Liu, Jiangsu (CN); Luping Zhang, Jiangsu (CN); Zixuan Wang, Jiangsu (CN); Dapeng Yan, Jiangsu (CN); Binbin Xu, Jiangsu (CN); Haiyan Sun, Jiangsu (CN); Lu Liu, Jiangsu (CN); Yufeng Guo, Jiangsu (CN)

(73) Assignees: NANJING UNIVERSITY OF POSTS AND TELECOMMUNICATIONS, Jiangsu (CN); NANTONG INSTITUTE OF NANJING UNIVERSITY OF POSTS AND TELECOMMUNICATIONS CO., LTD., Jiangsu (CN)

( * ) Notice: Subject to any disclaimer, the term of this patent is extended or adjusted under 35 U.S.C. 154(b) by 0 days.

(21) Appl. No.: 18/900,854

(22) Filed: Sep. 29, 2024

Related U.S. Application Data

(63) Continuation of application No. PCT/CN2024/099504, filed on Jun. 17, 2024.

(30) Foreign Application Priority Data

Mar. 11, 2024 (CN) .......................... 202410269404.4

(51) Int. Cl.
*G01R 31/3185* (2006.01)
*G01R 31/319* (2006.01)

(52) U.S. Cl.
CPC ............ *G01R 31/318597* (2013.01); *G01R 31/31908* (2013.01)

(58) Field of Classification Search
None
See application file for complete search history.

(56) References Cited

U.S. PATENT DOCUMENTS

| 6,115,763 A * | 9/2000 | Douskey | G06F 11/267 |
| | | | 710/72 |
| 2004/0006729 A1 * | 1/2004 | Pendurkar | G11C 29/32 |
| | | | 714/733 |

(Continued)

FOREIGN PATENT DOCUMENTS

| CN | 115295065 | 11/2022 |
| CN | 115910889 | 4/2023 |

(Continued)

OTHER PUBLICATIONS

IEEE STD 1687 (Year: 2014).*

(Continued)

*Primary Examiner* — Guerrier Merant
(74) *Attorney, Agent, or Firm* — JCIPRNET

(57) ABSTRACT

A universal test chiplet for testing a plurality of chiplets to be tested is provided. The universal test chiplet includes a chiplet test control circuit module, a test data distribution circuit module, a memory test configuration circuit module, and a chiplet test interface circuit module. The chiplet test control circuit module is configured to provide test data and configure test modes for the chiplets to be tested. The test data distribution circuit module is configured to distribute the test data required by each of the chiplets to be tested from a test data bus. The memory test configuration circuit module is configured to provide test circuits for memories of the chiplets to be tested and automatically generate a test vector. The chiplet test interface circuit module is configured to transmit the test data to the chiplets to be tested in any direction through chiplet test interfaces.

9 Claims, 12 Drawing Sheets

(56) References Cited

U.S. PATENT DOCUMENTS

| | | | |
|---|---|---|---|
| 2012/0204069 A1* | 8/2012 | Hughes | G11C 29/16 |
| | | | 714/E11.162 |
| 2016/0084903 A1 | 3/2016 | Melamed-Kohen et al. | |
| 2023/0204662 A1 | 6/2023 | Margulis et al. | |
| 2024/0354211 A1* | 10/2024 | Nelson | G06F 11/2221 |

FOREIGN PATENT DOCUMENTS

| | | |
|---|---|---|
| CN | 116256621 | 6/2023 |
| CN | 117572207 | 2/2024 |
| CN | 117872103 | 4/2024 |

OTHER PUBLICATIONS

Intact: A 96-Core Processor With Six Chiplets 3D-Stacked on an Active Interposer With Distributed Interconnects and Integrated Power Management (Year: 2021).*

"International Search Report (Form PCT/ISA/210) of PCT/CN2024/099504," mailed on Jul. 23, 2024, pp. 1-4.

"Written Opinion of the International Searching Authority (Form PCT/ISA/237) of PCT/CN2024/099504," mailed on Jul. 23, 2024, pp. 1-4.

\* cited by examiner

| Test instruction encoding | Test instruction | Test instruction enable signal |
|---|---|---|
| 1111 | Bypass instruction | Bypass_sel |
| 0111 | Test data distribution instruction | ijtag_sel |
| 1000 | Test path configuration instruction | path_sel |
| 1001 | Memory test configuration instruction | memory_sel |
| 1010 | Test interface configuration instruction | urim_sel |

FIG. 4

| Channel 0 | Channel 1 | Channel 2 | Channel 3 |
|---|---|---|---|
| 1 | 2 | 3 | 4 |
| 5 | 6 | 7 | 8 |
| 9 | 10 | 11 | 1 |
| 2 | 3 | 4 | 5 |
| 6 | 7 | 8 | 9 |
| 10 | 11 | 1 | 2 |
| 3 | 4 | 5 | 6 |
| 7 | 8 | 9 | 10 |
| 11 | 1 | 2 | 3 |
| ... | ... | ... | ... |

FIG. 10

UNIVERSAL TEST CHIPLET

CROSS-REFERENCE TO RELATED APPLICATION

This application is a continuation of international application of PCT application serial no. PCT/CN2024/099504, filed on Jun. 17, 2024, which claims the priority benefit of China application no. 202410269404.4, filed on Mar. 11, 2024. The entirety of each of the above-mentioned patent applications is hereby incorporated by reference herein and made a part of this specification.

TECHNICAL FIELD

The present disclosure belongs to the field of testability design for very-large-scale integrated circuits, and particularly relates to a universal test chiplet for testing chiplets.

DESCRIPTION OF RELATED ART

For half a century, Moore's Law has been guiding the development of the integrated circuit (IC) industry, and driving the continuous improvement of transistor density. However, starting from the 22 nm process technology, costs of each generation of technology have increased dramatically, and costs of chip design have risen exponentially as process nodes shrink. In recent years, as a size of the transistor approach physical limits, costs associated with advancements in the process nodes have become unaffordable, and improvements in chip performance have become less noticeable, indicating that Moore's Law is approaching its limits. With its unique advantages, chiplet technology is becoming a major trend in the development of the integrated circuit industry. One of its most significant advantages is cost reduction. By allowing each chiplet to adopt different processes and design methods, the chiplet technology can reduce the manufacturing costs selectively. Furthermore, the chiplet technology enables heterogeneous integration of a plurality of chiplets, further enhancing the overall integration and greatly improving performance of chips. Moreover, the chiplet technology has a short production cycle, and its modular design method allows each chiplet to be independently designed, manufactured, and tested, which accelerates the iteration speed of products. These characteristics make the chiplet technology become an effective way to cope with the gradual limits of Moore's Law and the increasing cost of fabrication processes, thereby providing new ideas for the future development of the integrated circuit industry.

However, during its promotion and application, the chiplet technology faces many challenges, among which testing of the chiplets becomes particularly complex when facing challenges such as complex heterogeneous chiplet integration systems and limited testing resources. Integration of the chiplets adopts highly complex multi-chiplet stacking structures, such as 2.5D and 3D packaging techniques, which require a customized testing solution for each chiplet to ensure the stability of the entire system. In a heterogeneous chiplet integration system, chiplets from different vendors have distinct testing schemes, making the management of testing resources for different chiplets become a significant challenge. Furthermore, a high integration density of chiplets, coupled with constraints on a number of test pins, results in a scarcity of testing resources.

In the prior art, a flexible configurable module that adopts a dual-line oblique symmetrical design structure is provided, configuration of the module is capable of realizing a dual-line transmission mode in the horizontal direction and a bidirectional transmission mode in a vertical direction. A chiplet test circuit based on the flexible configurable module offers a universal and scalable testing access structure for testability design of the chiplets. However, it is impossible to transmit test data for high-speed interfaces, limiting the efficiency of parallel testing and thereby restricting overall testing efficiency. Moreover, traditional methods requiring the addition of test circuits in each chiplet result in significant hardware overhead, and requires the testability design for each chiplet, leading to a long design cycle, and the current testability design for integrated chiplets mainly relies on standards such as IEEE 1149.1, IEEE 1500, and IEEE 1687, which are oriented towards 2D chips, such as SOC, resulting in poor versatility. Since chiplet test data are transmitted through a bus, it is difficult to achieve efficient and flexible configuration of the test, making it difficult to optimize test time and data volume.

SUMMARY

An objective of the present disclosure is to provide a universal test chiplet capable of embedding shared test resources required by a chiplet system to be tested, offering comprehensive, flexible, and efficient test support for the chiplet system, such that the problems in the prior art that a test circuit needs to be added for each of the chiplets to be tested, different test schemes need to be customized, resulting in poor universality and flexibility in the test.

Technical solution: a universal test chiplet in the present disclosure is configured to test M chiplets to be tested, where M is a positive integer, and the test chiplet includes:
  a chiplet test control circuit module, where the chiplet test control circuit module is connected to chiplets to be tested and a test data distribution circuit module, a memory test configuration circuit module, and a chiplet test interface circuit module, and is configured to receive external JTAG signals and to configure JTAG signals of the chiplets to be tested, as well as to provide test data and configure test modes for the chiplets to be tested, and to provide configuration signals for the memory test configuration circuit module, the chiplet test interface circuit module, and the chiplets to be tested;
  the test data distribution circuit module is connected to the chiplet test control circuit module and the chiplet test interface circuit module, and includes N test data channels, where N is a positive integer, and the test data distribution circuit module is configured to distribute test data required by each of the chiplets to be tested from a test data bus, so as to load or unload the test data channels;
  the memory test configuration circuit module is connected to a memory of the chiplets to be tested and the chiplet test control circuit module, and is configured to provide test circuits for memories of the chiplets to be tested and automatically generate a test vector; and
  the chiplet test interface circuit module is connected to the chiplets to be tested, the chiplet test control circuit module, and the test data distribution circuit module, and is configured to connect the test data channels into a single chain, and to transmit the test data to the chiplets to be tested in any direction (up, down, left, right) through chiplet test interfaces.

Further, the chiplet test control circuit module includes a test state control circuit unit, a test instruction circuit unit, a test sub-interface control circuit unit, and a test data circuit unit;

the test state control circuit unit includes a finite-state machine, and is configured to enable register enable signals activated in different test cycles, and transmit the register enable signals to the test sub-interface control circuit unit and the test instruction circuit unit;

the test instruction circuit unit includes a multi-bit instruction register, and each type of test code corresponds to one test instruction; and the test instruction circuit unit is configured to receive the register enable signals from the test state control circuit unit, generate corresponding test instruction enable signals, and transmit the test instruction enable signals to a test data circuit;

the test sub-interface control circuit unit is configured to receive external JTAG signals and configure the JTAG signals of the chiplets to be tested, output test responses to an external system, and string test data chains into a single chain; and the test data circuit unit includes a plurality of registers to provide configuration signals for the corresponding test sub-interface control circuit unit, the memory test configuration circuit module and the chiplet test interface circuit module according to the test instruction enable signals, and the test data circuit unit further includes an IJTAG network to provide configuration signals for the test data distribution circuit module.

Further, in the test data circuit unit, the IJTAG network is a 3-layer SIB-TDR structure;

a first layer includes M+1 SIBs, which are connected in a daisy-chain structure, where the M SIB_Ms are configured to control the enabling or disabling of tests for a single chiplet or a plurality of chiplets to be tested, and SIB0 is configured to control the enabling or disabling of shared configuration information TDR for the test data distribution circuit module;

a second layer includes a plurality of SIBs, with an SIB_M in the first layer individually controlling Q SIB_Qs in the second layer, where Q is a total number of test channels of the chiplets to be tested, and a SIB0 in the first layer controls SIB00 in the second layer; and a third layer includes a plurality of TDRs, with each of the SIBs in the second layer individually controlling a multi-bit TDR, a multi-bit TDR controlled by the SIB00 in the second layer is configured to load the shared configuration information of the test data distribution circuit module, and the remaining multi-bit TDRs are configured to provide initial read information of a data packet for the test data distribution circuit module.

Further, the test data circuit unit includes a test path configuration register, a memory test configuration register, and a universal test interface register, where the test path configuration register, the memory test configuration register and the universal test interface register are all multi-bit TDRs, which are respectively used to provide configuration signals for the test sub-interface control circuit, the memory test configuration circuit, and the chiplet test interface circuit.

Further, the test path configuration register includes a data register of 2M+1 bits with capture, shift, and update functions, which is configured to provide configuration signals for selecting a next chiplet test, setting an initial state value of the next chiplet test in advance, and keeping the configuration signals unchanged under other test instructions; and the test path configuration circuit transmits the configuration signals for selecting a next chiplet test, setting an initial state value of the next chiplet test in advance to the test sub-interface control circuit unit, which is configured to configure the JTAG signals of the chiplets to be tested.

Further, the test sub-interface control circuit unit string test data chains into a daisy chain; current chiplet chains to be tested are stringed into a single chain based on the configuration signals for selecting a next chiplet test transmitted from the test path configuration register; and the chiplets to be tested that is not tested currently is set to a reset or hold state based on the configuration signals for setting an initial state value of the next chiplet test in advance.

Further, the test data distribution circuit module includes M test data distribution hosts, and each of the chiplet test interfaces is connected to a test data interface of a chip;

each of the test data distribution host includes an N-to-1 multiplexer, a state machine, and a flip-flop; and a data input terminal of the N-to-1 multiplexer is connected to various test data channels of each test data bus, a selection terminal of the N-to-1 multiplexer is connected to output of the state machine, and the state machine selects the test data channel for a corresponding chip test interface; an output terminal of the N-to-1 multiplexer is connected to an input port of the flip-flop; and an output terminal of the flip-flop is connected to a test data input terminal of a chiplet test interface.

Further, the memory test configuration circuit module includes a main controller, sub-controllers, a test data generation circuit, and a comparator;

where the main controller is configured to assigns the secondary controller to each of the memories of the chiplets to be tested with different specifications, the secondary controller is configured to control a test state of the chiplets to be tested, the test data generation circuit is configured to automatically generate a test vector, and the comparator is configured to receives the test responses and determines whether there is any faults.

Further, when the test data bus is used for transmitting the test data, the chiplet test interface circuit module is configured for transmission either from bottom to top or from top to bottom.

Further, the chip test control circuit module is connected to five external JTAG test ports, four of which are the input ports, that is, test clock port (TCK), test mode selection port (TMS), test data input port (TDI), and test reset port (TRSTTDO), and the remaining one is an output port: test data output port TDO; where two ports that are connected to external test bus input and output port are bus_in and bus_out; in the chiplet system with M functional chips, the universal test chip provides test data to the chip to be tested through the JTAG interface, that is, tck_chip, trst_chip, tdi_chip[M−1:0], tms_chip[M−1:0] and tdo_chip[M−1:0], the universal chip test interface and the memory test configuration circuit interface.

Further, the test state control circuit unit is composed of a 16-bit finite-state machine defined by the JTAG standard. During a test instruction cycle, irSel signals are active (irSel=1); irce, irse, and irue are active at capture, shift, and update phases, test instruction circuit enable signals are outputted, the test instruction circuit is started, the irSel signals are connected to the test sub-interface control circuit unit and the test instruction circuit unit, and the irce, irse, and irue signals are connected to the test instruction circuit; during a test data cycle, drSel signals are active, and during the capture, shift, and update phases, drce, drse, and drue are active, test data circuit enable signals are outputted, the test data circuit is started, the drSel signals are connected to the test sub-interface control circuit unit and the test data circuit unit, and drce, drse, and drue signals are connected to the test data circuit unit.

Further, the test instruction circuit unit includes at least a 3-bit instruction register, where the instruction contained includes at least a test path configuration instruction, a memory test configuration instruction, a test data distribution instruction, a test interface configuration instruction, and a bypass instruction. In addition, other test instructions and built-in self-test instructions are supported; when other test components are added, additional test instructions need to be added to support the selection of corresponding data registers; and when the chiplets to be tested contains a circuit for the built-in self-test, corresponding instructions need to be added to start the built-in self-test. When the test path configuration instruction is selected, the test path configuration register is placed between the test data input and the test output port (TDI/TDO), that is, the test data register is selected as the test data register; when the memory configuration instruction is selected, the memory configuration circuit is placed between the test data input and the test data output port (TDI/TDO); when the test data distribution instruction is selected, the IJTAG network is placed between the test data input and the test output port (TDI/TDO); and when the bypass instruction is selected, a one-bit register is configured to bypass the internal data registers of the test chiplet (IP). When the test path configuration instruction, the memory test configuration instruction, the test interface configuration instruction, the test data distribution instruction, or the bypass instruction are selected, the corresponding test instruction enable signals are path_sel, memory_sel, urim_sel, ijtag_sel and bypass_sel.

Further, the test sub-interface control circuit unit receives external TCK, TRST, TMS signals, the test instruction circuit enable signals, as well as select [M−1:0] and initialize [M−1:0] signals provided by the test path configuration circuit, so as to provide JTAG signals for other chiplets to be tested and output test responses (TDO) to the external system; the test sub-interface control circuit unit strings the test data chains into a daisy chain, selects the chiplets to be tested through the select signals, that is, the test data output port and the test data input port are connected for testing; and the chiplets to be tested that cannot be tested currently are preset to be a reset or hold states through the initialize, such that the state can be synchronized when the test is performed later.

Further, the test data circuit unit also includes a bypass register, which is a 1-bit register for bypassing the test circuit of the chiplet under test.

Further, a user can add other test components or self-test circuits according to design requirements, a custom test data register can be accordingly added to the test data circuit unit to provide configuration signals and support other test instructions and built-in self-test instructions.

Further, the 2M+1 bits of the test path configuration register is select [M−1:0], initialize [M−1:0], and keep signals, respectively, which are responsible for the functions of selecting a next chiplet test, setting an initial state value of the next chiplet test in advance, and keeping the configuration signals unchanged under other test instructions.

Further, TDRs of the IJTAG network have capture, shift, and update functions, a bit width of the TDR is determined by a circuit scale, the shared configuration information includes a number of test data bus channels (bus_channel) and information of data packet reading location (chip_diff).

Further, in the test data distribution hosts of the test data distribution circuit module, the flip-flop is triggered by a falling edge of the TDDN_CLK, and the TDDN_CLK becomes valid after all the configuration information is transmitted into the TDR; the state machine has S states (S is a maximum number of the test data bus channels), a transition state of the state machine is jointly determined by bus_channel, fsm_init, and chip_diff, where bus_channel determines a total number of test states in the current test mode, that is, a number of test states of the state machine equals to a number of test data bus channels (number of bus channels); chip_diff denotes a difference between a multiplier of the number of bus channels and a number of opened chiplet test interfaces and is configured to determine a jump step size of the state machine during the test clock cycle; fsm_init denotes an initial state, and after the required configuration information is transmitted to a corresponding TDR, TDDN_reset is valid within a single clock cycle; and fsm_init is loaded into the finite-state machine, and the state is then converted to distribute bus data to the chiplet test interface in a test clock.

Further, the chip test interface circuit module supports the test data transmission in any direction (up, down, left, right), and the transmission direction is controlled by a 12-bit configuration signal. When the test interface configuration instruction is selected for the test instruction, the corresponding 12-bit TDR is placed between the TDI and the TDO, and the configuration signals are inputted from the TDI port. When the bus is used for transmitting the test data, the chip test interface circuit module is configured for transmission either from bottom to top (test data input port) or from top to bottom (test response output port). In the test chiplet, both horizontal transmission ports of the chiplet test interfaces are connected to each other to form a single chain, where one of the ports is connected to a 1-bit test data input port si, and the other thereof is connected to a 1-bit test response output port so, such that all the test channels are stringed into a single chain.

Further, the memory test configuration circuit module provides an on-chip test circuit for a non-embedded memory, and the on-chip test circuit can be shared among different memories, saving hardware overhead. The comparator is connected to an interface, which is connected to an external port of the test chiplet, and is connected to the memory of the test chiplet.

Based on the same inventive concept, a method for testing a test chiplet using the universal test chiplet provided in the present disclosure including the following steps: connecting the chiplets to be tested with the test chiplet, configuring a test mode and JTAG signals, having the chiplets to be tested received test data, and completing the test. The method specifically includes the following steps:

(1) configuring JTAG signals of the chiplets to be tested: the JTAG signals of the chiplets to be tested are configured using the chiplet test control circuit module to access and control internal test logic of the chiplets to be tested, so as to receive test data, and complete built-in self-test, and the like; (2) configuring the chiplet test interface circuit module: control signals of the chiplet test interface circuit module can be configured using the chiplet test control circuit module to control its transmission direction, so as to support the transmission of bus data to the chiplets to be tested; (3) configuring the test data distribution circuit module: bus information, test channel count information, and state transition information are transmitted through the chiplet test interface circuit module, configuration of the chiplet test control circuit module is completed according to a specific test environment, such that the conversion of high-speed transmission data to low-speed test data is realized, and high-speed transmission of data is thus completed, and scan test of the chiplets to be tested is thus completed; and (4) configuring the memory test configuration circuit module: signals are started through a JTAG interface to complete the on-chip self-test of the memory.

Names of the port/signals involved in the present disclosure are itemized in the table below:

| Signal name | Definition | Signal name | Definition |
|---|---|---|---|
| bus_in | Bus Input Signal | drse | Data Register Shift Enable Signal |
| bus_out | Bus Output Signal | drue | Data Register Update Enable Signal |
| TCK | Test Clock | path_sel | Path Select Signal |
| TMS | Test Mode Select | memory_sel | Memory Select Signal |
| TDI | Test Data Input | urim_sel | Test Interface Select Signal |
| TRST | Test Reset | ijtag_sel | iJATG Select Signal |
| TDO | Test Data Output | bypass_sel | Bypass Select Signal |
| tck_chip | Test Clock Signal to Chiplet Under Test | select | Select Signal for Chiplet Under Test |
| trst_chip | Test Reset Signal to Chiplet Under Test | initialize | Test State Initialize Signal |
| tdi_chip | Test Data Input Signal to Chiplet Under Test | keep | Test Configuration Keep Signal |
| tms_chip | Test Mode Select Signal to Chiplet Under Test | bus_channel | Number of Bus Channels Signal |
| tdo_chip | Test Data Output Signal to Chiplet Under Test | chip_diff | Jump Step Length Signal |
| irSel | Instruction Register Enable Signal | fsm_init | Initial State Signal |
| irce | Instruction Register Capture Enable Signal | SIB | Segment Insert Bit |
| irse | Instruction Register Shift Enable Signal | TDR | Test Data Register |
| irue | Instruction Register Update Enable Signal | TDDH | Test Data Distribution Host |
| drSel | Data Register Enable Signal | TDDN | Test Data Distribution Network |
| drce | Data Register Capture Enable Signal | | |

Beneficial effects: compared with the prior art, the present disclosure has the following beneficial effect: (1) in the present disclosure, resources required for testing of chiplets are embedded into a single test chiplet, which is responsible for transmitting data to and from external test pins outside the chiplet, configuring test channels among the functional chiplets, setting a test modes for each of the chiplets to be tested, and sharing test components of the memories to provide a low-cost, non-embedded memory testing circuit, controlling and managing test data volume of different chiplets, and the method supports a plug-and-play strategy for chiplet system testing, offering a comprehensive, flexible, and efficient testing solution; (2) the chiplet test control circuit module integrates the configuration access function of the chiplet system test components, allowing for easy control of internal test logic from external test ports after binding, thereby solving the problem of cross-layer access to chiplets; (3) the test data distribution network solves the problem for moving data into and out from the chiplet system at a high speed, enabling high-speed interface scan testing. In addition, the test data distribution network can be dynamically configured according to actual testing needs, providing greater flexibility; and (4) the connection mode of the IJTAG network facilitates the free switching of TDRs, and can transmit the configuration information according to actual situation, saving the test time.

BRIEF DESCRIPTION OF THE DRAWINGS

FIG. 4 is a diagram showing corresponding relationships among test instruction encoding, test instructions, and test instruction enable signals according to an embodiment of the present disclosure.

FIG. 10 is a schematic diagram of distribution of data packets according to Example 1 of the present disclosure.

DESCRIPTION OF THE EMBODIMENTS

The technical solution of the present disclosure will be further described below with reference to the accompanying drawings.

Example 1

Figure 1:
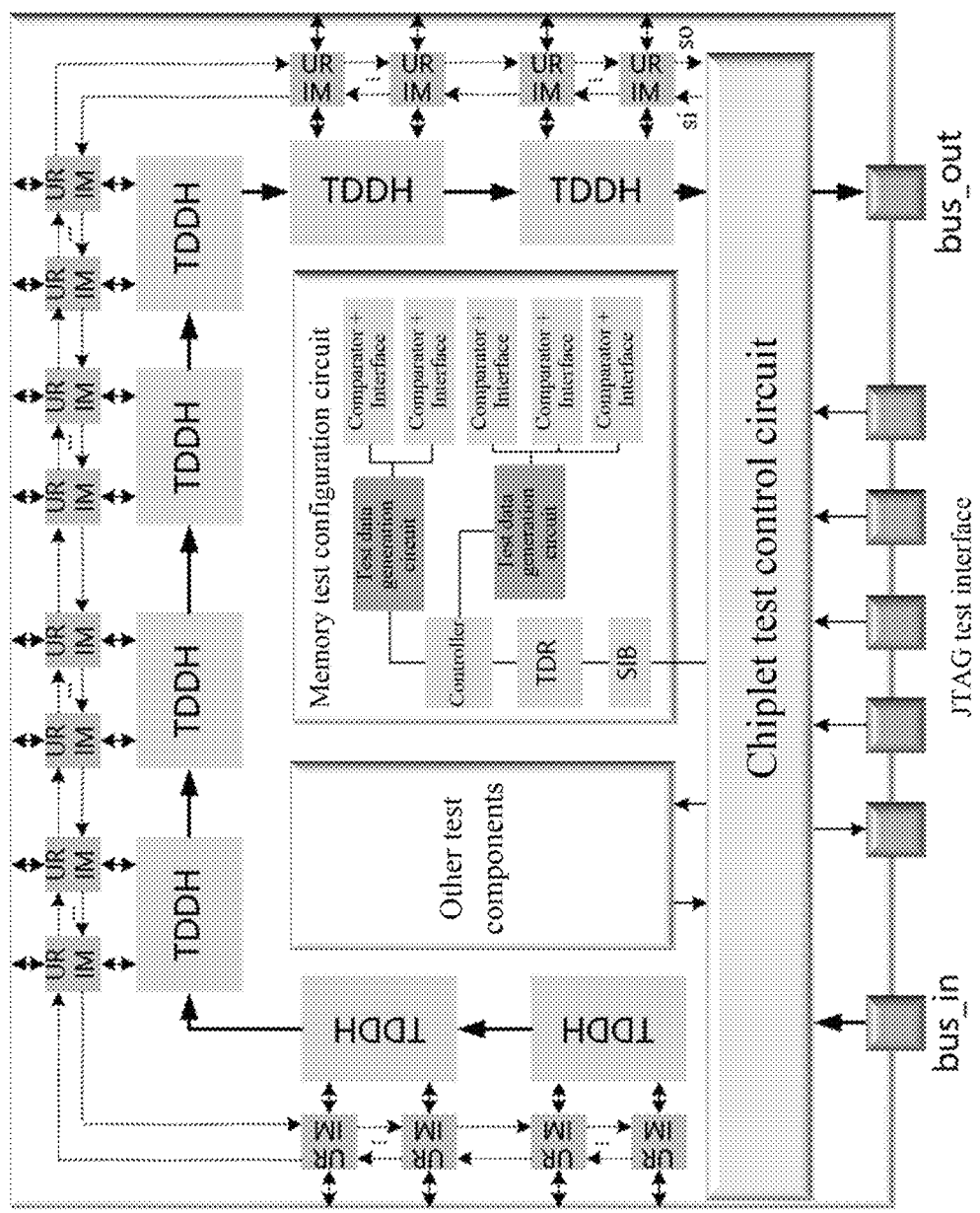
FIG. 1 is a structural schematic diagram of a universal test chiplet according to the present disclosure.

As shown in FIG. 1, a universal test chiplet in the present disclosure includes a chiplet test control circuit module, a test data distribution circuit module, a memory test configuration circuit module, and a chiplet test interface circuit module.

Specifically, the chiplet test control circuit module is connected to chiplets to be tested and the test data distribution circuit module, the memory test configuration circuit module, and the chiplet test interface circuit module, and is configured to receive external JTAG signals and to configure JTAG signals of the chiplets to be tested, as well as to provide test data and configure test modes for the chiplets to be tested, and to provide configuration signals for the memory test configuration circuit module, the chiplet test interface circuit module, and the chiplets to be tested;

the test data distribution circuit module is connected to the chiplet test control circuit module and the chiplet test interface circuit module, and includes N test data channels, where N is a positive integer, and the test data distribution circuit module is configured to distribute test data required by each of the chiplets to be tested from a test data bus, so as to load or unload the test data channels;

the memory test configuration circuit module is connected to a memory of the chiplets to be tested and the chiplet test control circuit module, and is configured to provide test circuits for memories of the chiplets to be tested and automatically generate a test vector; and the chiplet test interface circuit module is connected to the chiplets to be tested, the chiplet test control circuit module, and the test data distribution circuit module, and is configured to connect the test data channels into a single chain, and to transmit the test data to the chiplets to be tested in any direction (up, down, left, right) through chiplet test interfaces.

A user can add other test components or self-test circuits according to design requirements, a custom test data register can be accordingly added to the chiplet test control circuit module to provide configuration signals and support other test instructions and built-in self-test instructions;

when other test components are added, additional test instructions need to be added to support the selection of corresponding data registers; and when the chiplets to be tested contains a circuit for the built-in self-test, corresponding instructions need to be added to start the built-in self-test.

Figure 2:
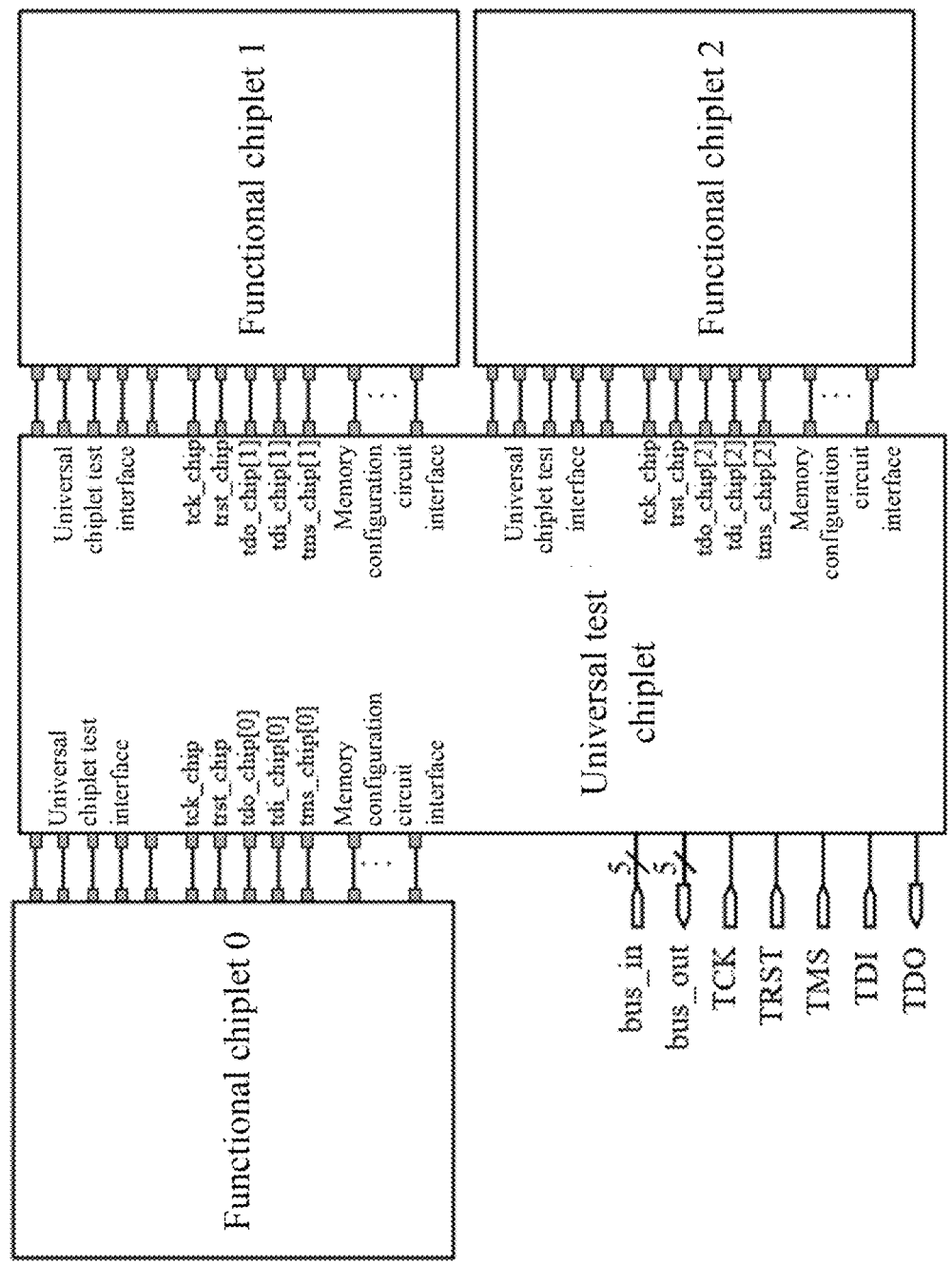
FIG. 2 is a structural schematic diagram of a chiplet system according to an embodiment of the present disclosure.

As shown in FIG. 2, a chiplet system in this example includes the universal test chiplet, three functional chiplets (that is, chiplets to be test), and a maximum number of bus channels is 5, and the universal test chiplet provides 5 chiplet test interfaces (URIM) for each of the functional chiplets. A number of connected functional chiplets that are actually connected, the chiplet test interfaces, and the maximum number of bus channels can be determined according to an actual circuit scale and testing requirements.

Figure 3:
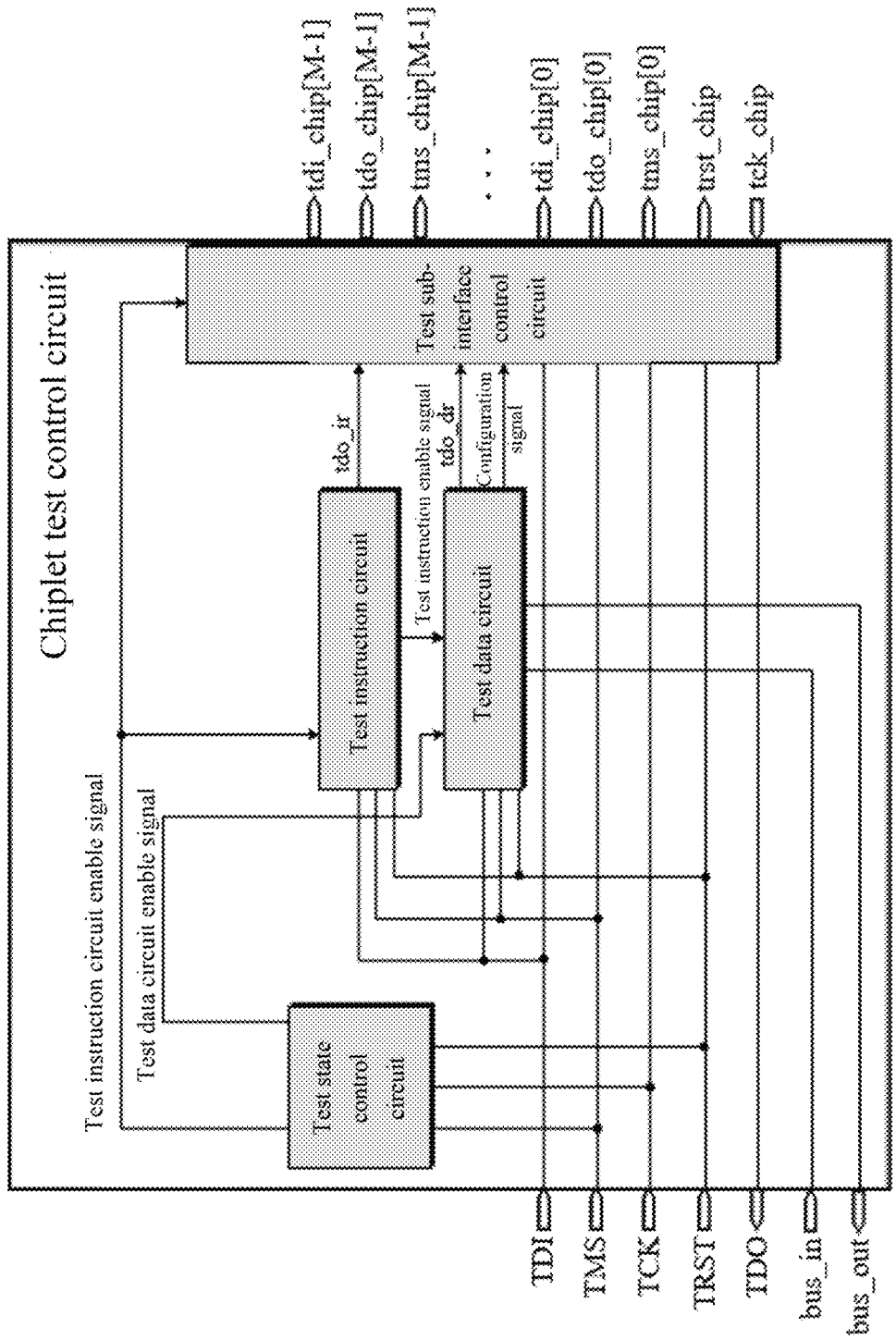
FIG. 3 is a structural schematic diagram of a chiplet test control circuit module according to the present disclosure.

As shown in FIG. 3, the chiplet test control circuit module includes a test state control circuit unit, a test instruction circuit unit, a test sub-interface control circuit unit, and a test data circuit unit. Three signals TDI, TMS, and TCK are inputted into the test state control circuit, the TMS selects a test state, the TDI inputs the instruction/data information, and output is enable signals for a test instruction circuit and a test data circuit. During a test instruction cycle, the test instruction circuit enable signal is outputted, the test instruction circuit is activated, and is controlled to capture, shift, and update operations under the action of a finite-state machine; and during the test instruction cycle, the enable signal for the test data circuit is outputted, the test data circuit is activated, and is controlled to capture, shift, and update operations under the control of the finite-state machine.

The test instruction circuit unit is composed of multi-bit instruction registers. In this example, each of the instruction registers is 4-bit, and corresponding relationships among test instruction encoding, the test instruction, and a test instruction enable signal are shown in FIG. 4. The test instruction includes a test path configuration instruction, a memory test configuration instruction, a test interface configuration instruction, a test data distribution instruction, and a bypass instruction.

Figure 5:
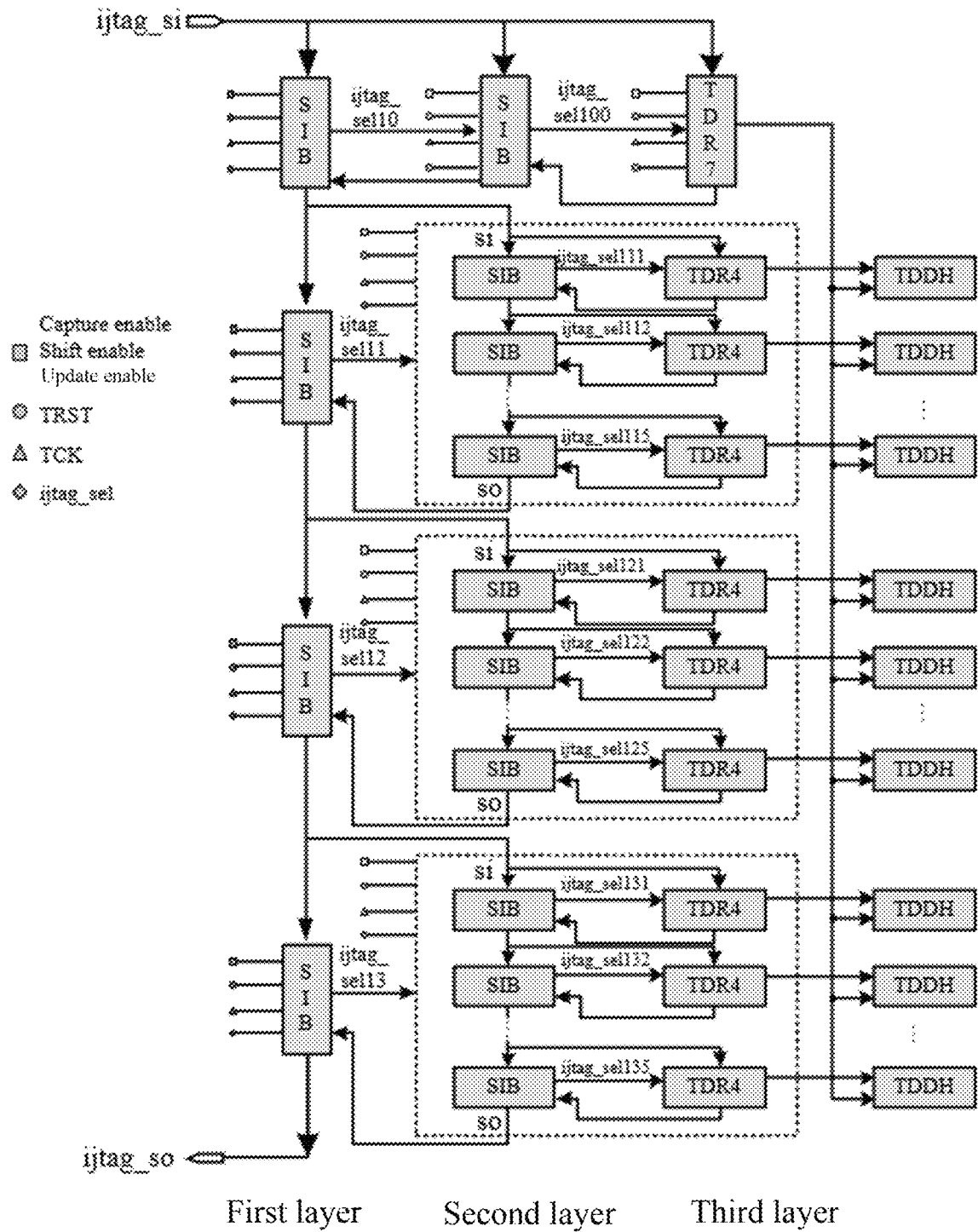
FIG. 5 is a structural schematic diagram of an IJTAG network according to the present disclosure.

During the test instruction cycle, the test state control circuit unit inputs 0111, enters a state of the test data distribution instruction, and places an IJTAG network of the test data circuit unit between TDI and TDO, that is, the IJTAG network is selected to transfer configuration data to the test data circuit unit. A framework of the IJTAG network is shown in FIG. 5, specifically, a first layer thereof consists of 4 SIBs, connected in the single chain, and one of the SIBs controls a TDR that transmits shared configuration information for all TDDHs, and outputted enable signal is ijtag_sel10; and the other three SIBs control whether test channels of the three functional chiplets need to be opened, and outputted enable signals are ijtag_sel11, ijtag_sel12, and ijtag_sel13, respectively; a second layer consists of 16 SIBs, where the ijtag_sel10 controls 1 SIB, the ijtag_sel11, the ijtag_sel12, and the ijtag_sel13 each controls 5 SIBs, respectively, that is, the SIBs in the second layer are configured to control whether each chiplet test interface is opened; and a third layer consists of 16 TDRs, each of the SIBs in the second layer controls one TDR, where the SIB that transmits the shared configuration information is set to 7 bits, with 1 bit for holding the signal, 3 bits for indicating a number of chiplet test bus channels (bus_channel), and 3 bits for indicating a difference between a multiplier of the number of bus channels and a number of opened chiplet test interfaces (chip_diff), and the remaining 15 TDRs are 4-bit, with 1 bit for holding the signal, and 3 bits for an initial value of the chiplet test bus channels (fsm_init). After the required configuration information is transmitted to a corresponding TDR, TDDN_reset is valid within a single clock cycle, fsm_init is loaded into the finite-state machine, a TDDN_CLK becomes valid, and the corresponding TDDH begins operation.

Figure 6:
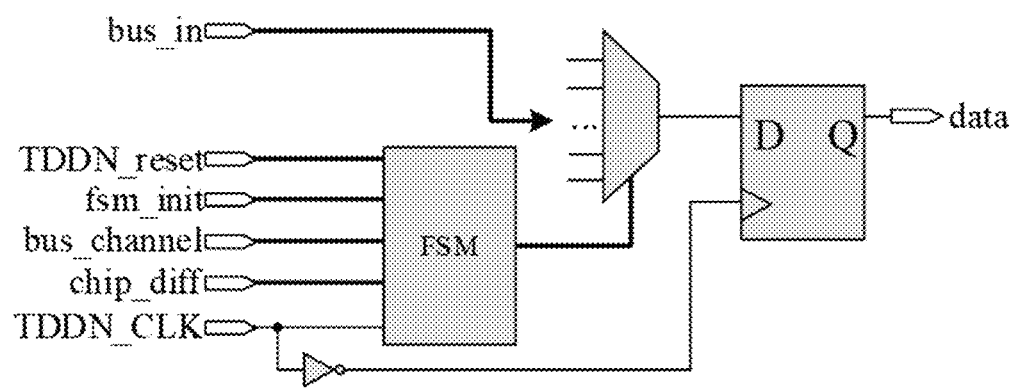
FIG. 6 is a structural schematic diagram of a test data distribution host according to the present disclosure.
Figure 7:
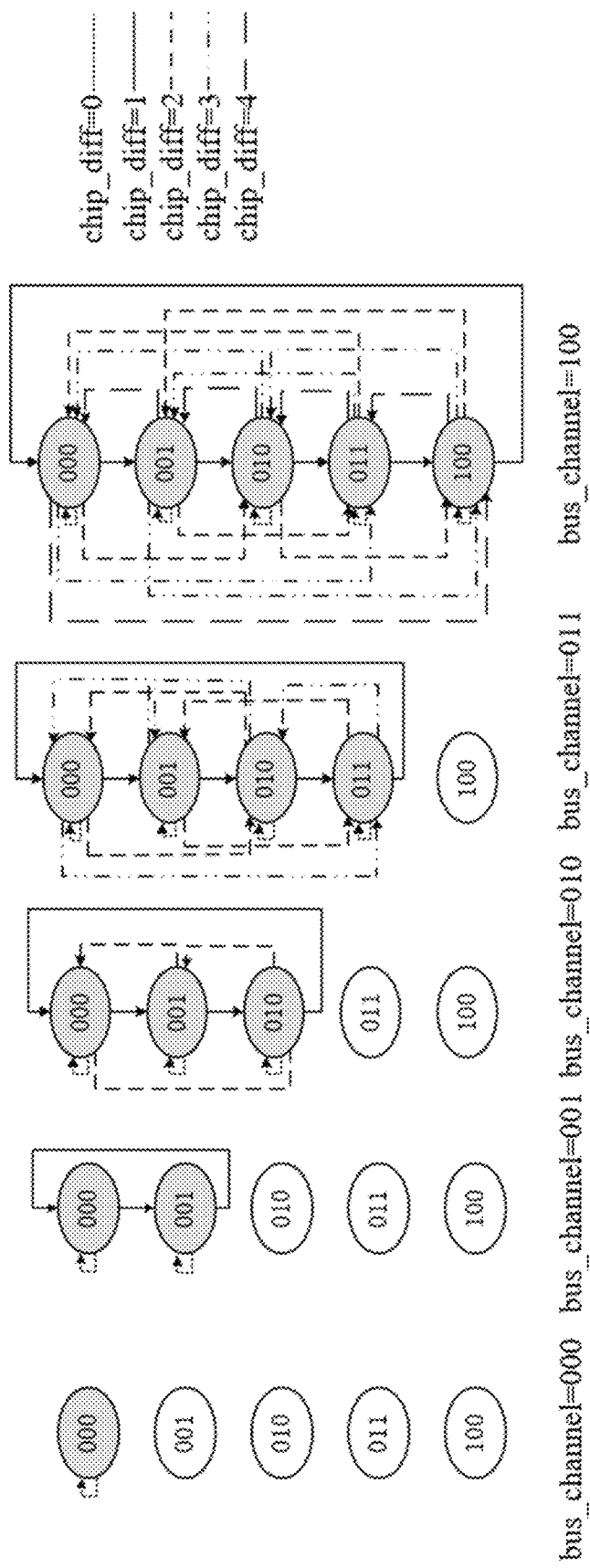
FIG. 7 is a structural schematic diagram of a state machine of a test data distribution host according to Example 1 of the present disclosure.

A structural schematic diagram of the TDDH is shown in FIG. 6, and the TDDH is configured to configure the test data for each opened test interface based on the number of test data bus channels and an opening status of the chiplet test interface. The TDDH is composed of a 5-to-1 multiplexer, a finite-state machine (FSM), and a D flip-flop, a data input of an N-to-1 multiplexer is connected to all the channels of each bus, a selection terminal is connected to output of the finite-state machine, an output terminal of the multiplexer is connected to an input port of the D flip-flop, the D flip-flop is triggered by a falling edge of the TDDN_CLK, which becomes valid after all the configuration information is transmitted into the TDR, and a data input terminal (D) of the D flip-flop is connected to the output terminal of the multiplexer, and a data output terminal (Q) of the D flip-flop is connected to a test data input terminal of a universal chiplet test interface. A structure of the FSM is shown in FIG. 7, and the FSM has 5 states, corresponding to outputs 000, 001, 010, 011, and 100, which respectively select 1st, 2nd, 3rd, 4th, and 5th channels of the bus. A transition state of the FSM is jointly determined by bus_channel, fsm_init, and chip_diff, where the bus_channel represents a valid state, and when the bus_channel is 000, 001, 010, 011, or 100, respective, the number of bus channels is 1, 2, 3, 4, or 5, and the a number of valid states of the FSM is 1, 2, 3, 4, or 5, respectively, as shown in gray filling in FIG. 7; fsm_init represents an initial state, and is transmitted through the IJTAG network; and chip_diff represents a jump step size and is also transmitted through the IJTAG network.

Figure 8:
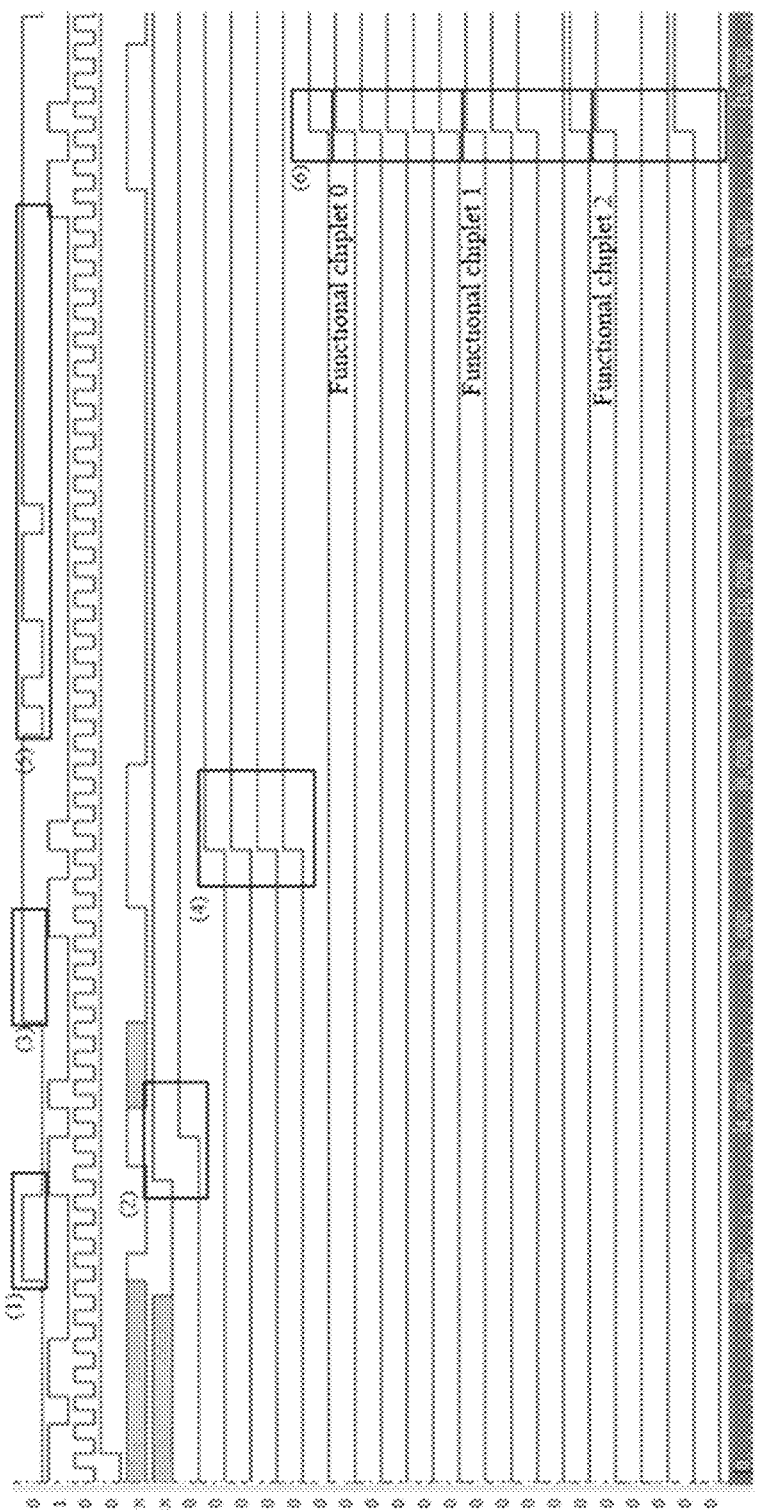
FIG. 8 is a simulation waveform diagram of a test chiplet configured with a SIB network in an IJTAG according to Example 1 of the present disclosure.

FIG. 8 is a simulation waveform diagram of a SIB network of the test chiplet configured with IJTAG, specifically, a code 0111 is shifted in Box (1) of FIG. 8 from a test data input (TDI) port; in Box (2) of FIG. 8, TDDN_decoded is raised to 1, indicating that a test data distribution instruction is set, an ijtag_sel enable signal is raised at the same time, and TDI points to the SIB network; test data 1111 is shifted in Box (3) of FIG. 8; it can be observed from Box (4) of FIG. 8 that all the SIB networks in the first layer are activated, and outputted enable is 1; the test data are continuously shifted in Box (4) of FIG. 8, and the SIBs network in the second layer are configured; and it can be observed from Box (6) of FIG. 8 that all SIB networks that control the transmission of shared configuration information are activated, all SIB networks that control test interfaces for transmitting a functional chiplet 0 are activated, and 4 of the SIB networks that control test interfaces for transmitting a functional chiplet 1 are activated, and 2 of the SIB networks that control test interfaces for transmitting a functional chiplet 2 are activated.

Figure 9:
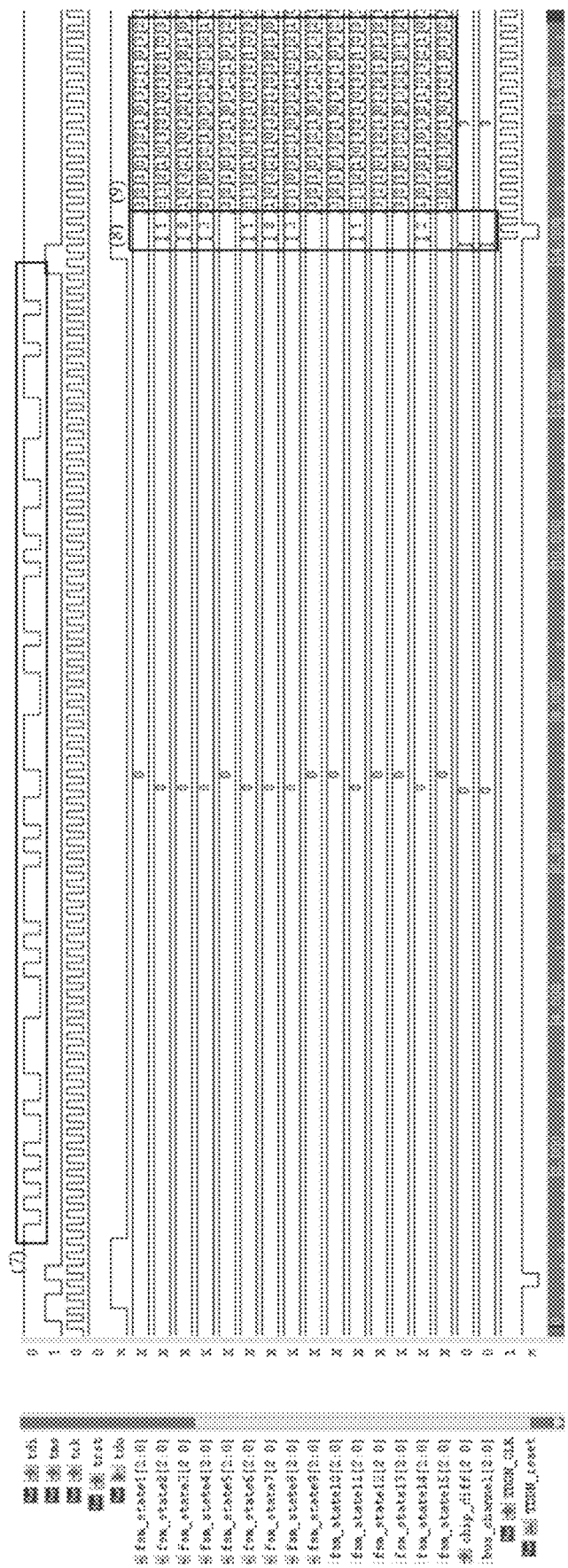
FIG. 9 is a simulation waveform diagram of data configuration and operation of a test data distribution host according to Example 1 of the present disclosure.

After configuration is completed, the TDR can be shifted through the TDI port, as shown in Box (7) of FIG. 9. After shift is completed, the TDDN_reset becomes invalid, the fsm_init is loaded into the FSM, chip_diff=011, and bus_channel=011, as shown in Box (8) of FIG. 9, that is, the number of bus channel count is set to 4, and the jump step size is set to 3, output of the FSM is shown in Box (9) of FIG. 9, indicating channel positions from which the test data is read, corresponding to channels 0, 1, 2, and 3, and data packet distribution is specifically shown in FIG. 10.

Example 2

A structure, a chiplet system, and test instructions of a universal test chiplet in this embodiment are the same as those in Embodiment 1.

During a test instruction cycle, the test state control circuit unit inputs 1000, the test path configuration register is then placed between a test data input port (TDI) and a test data output port (TDO), and the test path configuration register is a 7-bit test data register, which is keep, select [2:0], and initialize [2:0], respectively. The select [2:0] and initialize [2:0] signals are transmitted to a test sub-interface control circuit to control JTAG signals transmitted to other functional chiplets.

Figure 11:
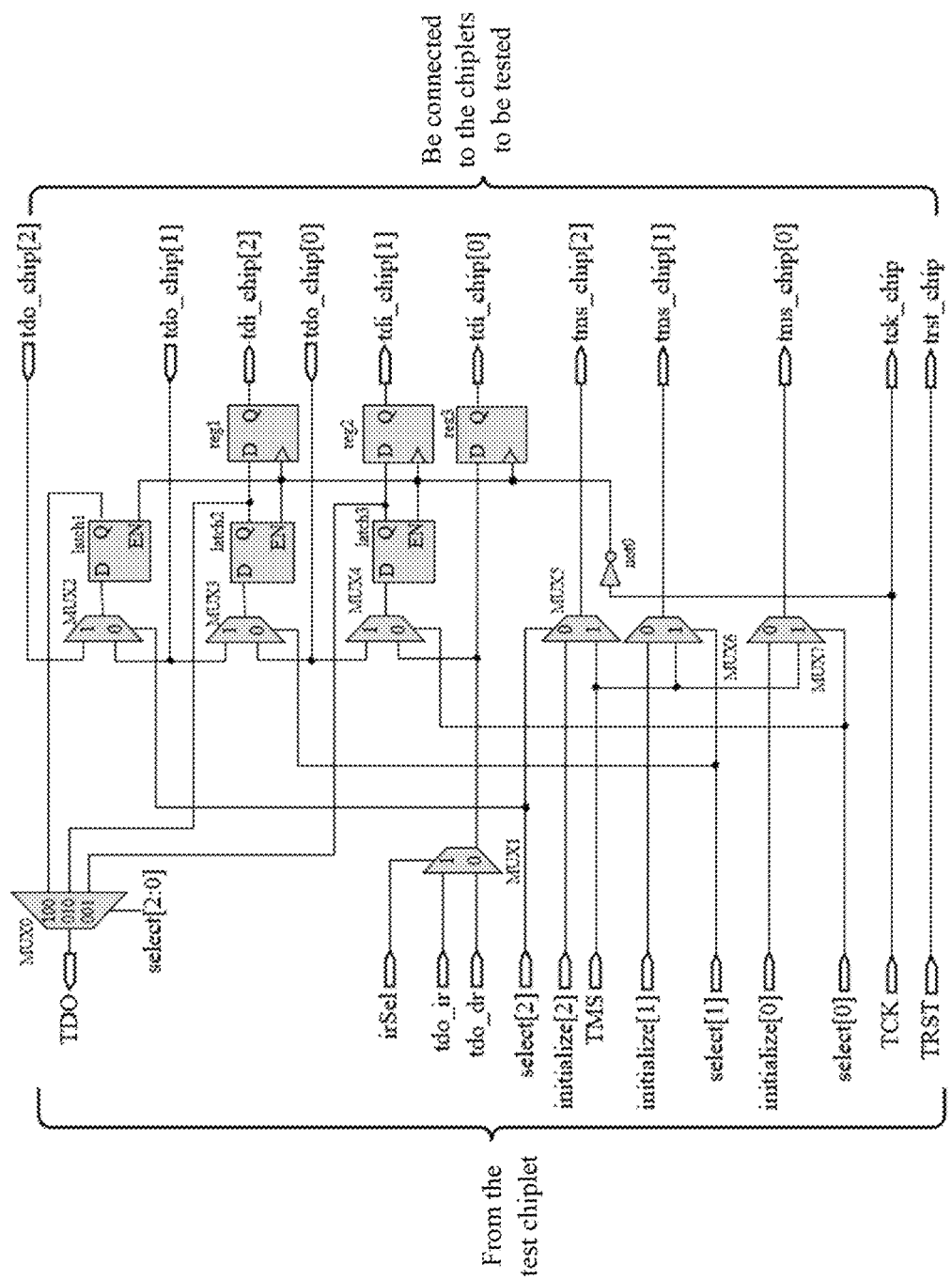
FIG. 11 is a structural schematic diagram of a test sub-interface control circuit unit according to Example 2 of the present disclosure.

The test sub-interface control circuit, as shown in FIG. 11, is configured to connect the JTAG signals between the test chiplet and the functional chiplets. The test sub-interface control circuit is connected to the test chiplet via external signals TRST, TCK, TMS, and TDO, the test path configuration register outputs signals select [2:0] and initialize [2:0], the test state control circuit unit outputs a signal irSel, the test instruction circuit unit outputs a signal tdo_ir, and the test data circuit unit outputs a signal tdo_dr, which is connected to a functional chiplet 0 through tck_chip, trst_chip, tdi_chip[0], tms_chip[0] and tdo_chip[0], and connected to a functional chiplet 1 through tck_chip, trst_chip, tdi_chip[1], tms_chip[1] and tdo_chip[1], and connected to a functional chiplet 2 through tck_chip, trst_chip, tdi_chip[2], tms_chip[2], and tdo_chip[2].

An output signal trst_chip is connected to an input signal TRST; an output signal tck_chip is connected to an input signal TCK; 0 input terminals of 2-to-1 data selectors (MUX5, MUX6, and MUX7) are connected to initialize [0], initialize [1], initialize [2], respectively, 1 input terminals thereof are connected to the input signal TMS, and output terminals thereof are tms_chip[0], tms_chip[1], and tms_chip[2], respectively; the 1 input terminal of a 2-to-1 data selector (MUX1) is connected to the input signal tdo_ir, the 0 input terminal thereof is connected to the input signal tdo_dr, a selection terminal is connected to the input signal irSel, and the output terminal thereof is connected to a D input of a reg3; input terminals of NOT gates labeled "not0" are connected to the input signal TCK, and output terminals thereof are connected to clock terminals of reg1, reg2, reg3, and enable terminals of latch1, latch2, and latch3; an output terminal of the D flip-flop reg3 is the output terminal chip_tdi[0]; a 0 input terminal of a 2-to-1 data selector (MUX4) is connected to the output terminal of MUX1, a 1 input terminal thereof is connected to the input signal tdo_chip[0], and an output terminal thereof is connected to a D input terminal of the latch3; an output signal of the latch3 is connected to a D input terminal of the D flip-flop reg2; an output terminal of the D flip-flop reg2 is connected to the output signal tdi_chip[1]; a 0 input terminal of a 2-to-1 data selector (MUX3) is connected to the input signal tdo_chip[0], a 1 input terminal thereof is connected to the input signal tdo_chip[1], and an output terminal thereof is connected to a D input terminal of the latch2; an output signal of the latch2 is connected to a D input terminal of the D flip-flop reg1; an output terminal of the D flip-flop reg1 is the output signal tdi_chip[2]; the 0 input terminal of a 2-to-1 data selector (MUX3) is connected to the input signal tdo_chip[1], the 1 input terminal thereof is connected to the input signal tdo_chip[2], and an output terminal thereof is connected to a D input terminal of the lath latch1; output terminals of the latches (latch1, latch2 and latch3) are connected to 100, 010, and 001 input terminals of a multiplexer MUX0, respectively, and output terminals of the multiplexer MUX0 is the output signal TDO.

The test sub-interface control circuit directly transmits the externally inputted TCK and TRST signals from the test chiplet to the functional chiplets; when one of the functional chiplets is selected for testing, the corresponding select signal of the functional chiplet is set to 1, TMS signals outputted to the functional chiplet are synchronized with TMS signals of the test chiplet, the output signal TDO is set to a test response signal tdo_chip from the functional chiplet, states of the corresponding FSM of the remaining untested functional chiplets are preset by outputting initialize signals to the tms_chip terminal of the corresponding functional chiplet; and the input signal TDI is connected to tdi_chip[0] of the functional chiplet 0, and the test response signal tdo_chip[0] is connected to a next functional chiplet, that is, tdi[0] of the functional chiplet 1, forming a daisy chain from start to end.

Figure 12:
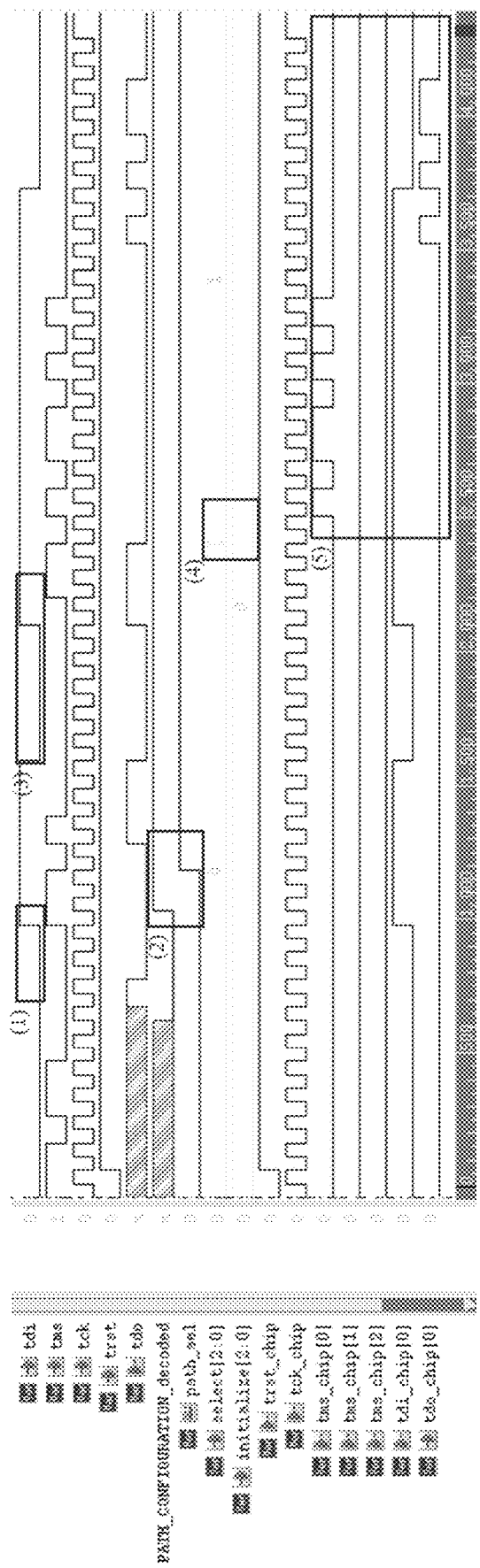
FIG. 12 is a simulation waveform diagram of a test path configuration according to Example 2 of the present disclosure.

A simulation waveform diagram of the sub-interface control circuit is shown in FIG. 12. Box (1) of FIG. 12 indicates the entry of a test instruction 1000; in Box (2) of FIG. 12, it can be observed that a test path configuration instruction PATH_CONFIGURATION_decoded is enabled and set to be 1, and the enable signal path_sel is also set to be 1, indicating an active state; and BOX (3) of FIG. 12 indicates the entry of a test path configuration signal, initialize [2:0]=000, that is, tms is set to be 0 when the test is not selected, and select [2:0]=001, that is, the functional chiplet 0 is selected for test, and keep=1 keeps the configuration signal unchanged; in Box (4) of FIG. 12, it can be observed that initialize and select signals have been loaded; in Box (5) of FIG. 12, it can be observed that tms_chip[0] is synchronized with the external input signal TMS, tms_chip[1] and tms_chip[2] are kept at 0, and a value of TDi is inputted into tdi_chip[0]; and a value of tdo_chip[0] is outputted through a TDO port, indicating that the configuration is successful.

Example 3

A method for testing a test chiplet using the universal test chiplet provided in the present disclosure including the following steps: connecting the chiplets to be tested with the test chiplet, configuring a test mode and JTAG signals, having the chiplets to be tested received test data, and completing the test. The method specifically includes the following steps:
 (1) configure JTAG signals of the chiplets to be tested: the JTAG signals of the chiplets to be tested are configured using the chiplet test control circuit module to access and control internal test logic of the chiplets to be tested, so as to receive test data, and complete built-in self-test, and the like;
 (2) configure the chiplet test interface circuit module: control signals of the chiplet test interface circuit module can be configured using the chiplet test control circuit module to control its transmission direction, so as to support the transmission of bus data to the chiplets to be tested;
 (3) configure the test data distribution circuit module: bus information, test channel count information, and state transition information are transmitted through the chiplet test interface circuit module, configuration of the chiplet test control circuit module is completed according to a specific test environment, such that the conversion of high-speed transmission data to low-speed test data is realized, and high-speed transmission of data is thus completed, and scan test of the chiplets to be tested is thus completed; and
 (4) configure the memory test configuration circuit module: signals are started through a JTAG interface to complete the on-chip self-test of the memory.

What is claimed is:

1. A universal test chiplet, wherein the universal test chiplet is configured to test M chiplets to be tested, M is a positive integer, and the universal test chiplet comprising:
 a chiplet test control circuit, wherein the chiplet test control circuit is connected to the chiplets to be tested, a test data distribution circuit, a memory test configuration circuit and a chiplet test interface circuit, wherein the chiplet test control circuit is configured to receive external JTAG signals and to configure JTAG signals of the chiplets to be tested, as well as to provide test data and configure test modes for the chiplets to be tested, and to provide configuration signals for the memory test configuration circuit, the chiplet test interface circuit, and the chiplets to be tested;
 the test data distribution circuit, which is connected to the chiplet test control circuit and the chiplet test interface circuit, wherein the test data distribution circuit comprises N test data channels, wherein N is a positive integer, and the test data distribution circuit is configured to distribute test data required by each of the chiplets to be tested from a test data bus, so as to load or unload the test data channels;
 the memory test configuration circuit, which is connected to a memory of the chiplets to be tested and the chiplet test control circuit, wherein the memory test configuration circuit is configured to provide test circuits for the memory of the chiplets to be tested and automatically generate a test vector; and
 the chiplet test interface circuit, which is connected to the chiplets to be tested, the chiplet test control circuit, and the test data distribution circuit, wherein the chiplet test interface circuit is configured to connect the test data channels into a single chain, and to transmit the test data to the chiplets to be tested, along any direction including up, down, left, right, through chiplet test interfaces,
 wherein the chiplet test control circuit comprises a test state control circuit unit, a test instruction circuit unit, a test sub-interface control circuit unit, and a test data circuit unit; wherein
 the test state control circuit unit comprises a finite-state machine, and is configured to enable register enable signals activated in different test cycles, and transmit the register enable signals to the test sub-interface control circuit unit and the test instruction circuit unit;
 the test instruction circuit unit comprises a multi-bit instruction register, and each type of test code corresponds to one test instruction; and the test instruction circuit unit is configured to receive the register enable signals from the test state control circuit unit, generate corresponding test instruction enable signals, and transmit the test instruction enable signals to a test data circuit;
 the test sub-interface control circuit unit is configured to receive external JTAG signals and configure the JTAG signals of the chiplets to be tested, output test responses to an external system, and string test data chains into a single chain; and
 the test data circuit unit comprises a plurality of registers to provide configuration signals for the corresponding test sub-interface control circuit unit, the memory test configuration circuit and the chiplet test interface circuit according to the test instruction enable signals, and the test data circuit unit further comprises an IJTAG network to provide configuration signals for the test data distribution circuit.

2. The universal test chiplet according to claim 1, wherein in the test data circuit unit, the IJTAG network is a 3-layer SIB-TDR structure; wherein
 a first layer comprises M+1 SIBs, which are connected in a daisy-chain structure, wherein the M SIB_Ms are configured to control the enabling or disabling of tests for a single chiplet or a plurality of chiplets to be tested, and SIB0 is configured to control the enabling or disabling of shared configuration information TDR for the test data distribution circuit;
 a second layer comprises a plurality of SIBs, with a SIB_M in the first layer individually controlling Q SIB_Qs in the second layer, wherein Q is a total number of test channels of the chiplets to be tested, and a SIB0 in the first layer controls SIB00 in the second layer; and
 a third layer comprises a plurality of TDRs, with each of the SIBs in the second layer individually controlling a multi-bit TDR, a multi-bit TDR controlled by the SIB00 in the second layer is configured to load the shared configuration information of the test data distribution circuit, and the remaining multi-bit TDRs are configured to provide initial read information of a data packet for the test data distribution circuit.

3. The universal test chiplet according to claim 1, wherein the test data circuit unit comprises a test path configuration register, a memory test configuration register, and a universal test interface register, wherein the test path configuration register, the memory test configuration register and the universal test interface register are all multi-bit TDRs, which are respectively used to provide configuration signals for the test sub-interface control circuit, the memory test configuration circuit, and the chiplet test interface circuit.

4. The universal test chiplet according to claim 3, wherein the test path configuration register comprises a data register of 2M+1 bits with capture, shift, and update functions, which is configured to provide configuration signals for selecting a next chiplet test, setting an initial state value of the next chiplet test in advance, and keeping the configuration signals unchanged under other test instructions; and
the test path configuration circuit transmits the configuration signals for selecting a next chiplet test, setting an initial state value of the next chiplet test in advance to the test sub-interface control circuit unit, which is configured to configure the JTAG signals of the chiplets to be tested.

5. The universal test chiplet according to claim 4, wherein the test sub-interface control circuit unit strings test data chains into a daisy chain; current chiplet chains to be tested are stringed into a single chain based on the configuration signals for selecting a next chiplet test transmitted from the test path configuration register; and the chiplets to be tested that is not tested currently is set to a reset or hold state based on the configuration signals for setting an initial state value of the next chiplet test in advance.

6. The universal test chiplet according to claim 1, wherein the test data distribution circuit comprises M test data distribution hosts, and each of the chiplet test interfaces is connected to one of the test data distribution hosts; wherein
each of the test data distribution hosts comprises an N-to-1 multiplexer, a state machine, and a flip-flop; and
a data input terminal of the N-to-1 multiplexer is connected to various test data channels of each test data bus, a selection terminal of the N-to-1 multiplexer is connected to output of the state machine, and the state machine selects the test data channel for a corresponding chip test interface; an output terminal of the N-to-1 multiplexer is connected to an input port of the flip-flop; and an output terminal of the flip-flop is connected to a test data input terminal of a chiplet test interface.

7. The universal test chiplet according to claim 1, wherein the memory test configuration circuit comprises a main controller, a sub-controller, a test data generation circuit, and a comparator; wherein
the main controller is configured to assigns the sub-controller to each of the memories of the chiplets to be tested with different specifications, the sub-controller is configured to control a test state of the chiplets to be tested, the test data generation circuit is configured to automatically generate a test vector, and the comparator is configured to receives test responses and determines whether there is any faults.

8. A method for testing chiplets using the universal test chiplet according to claim 1, comprising the following steps:
connecting chiplets to be tested with the universal test chiplet;
configuring the test mode and JTAG signals;
receiving test data by the chiplets to be tested; and
completing the test.

9. The universal test chiplet according to claim 1, wherein when transmitting the test data using the test data bus, the chiplet test interface circuit module is configured for transmission either from bottom to top or from top to bottom.

* * * * *